United States Patent [19]

Korenaga et al.

[11] Patent Number: 5,224,139
[45] Date of Patent: Jun. 29, 1993

[54] X-RAY MASK AND SEMICONDUCTOR DEVICE MANUFACTURING METHOD USING THE SAME

[75] Inventors: Nobushige Korenaga, Sagamihara; Hiroshi Maehara, Yokohama, both of Japan

[73] Assignee: Canon Kabushiki Kaisha, Tokyo, Japan

[21] Appl. No.: 936,510

[22] Filed: Aug. 28, 1992

[30] Foreign Application Priority Data

Sep. 10, 1991 [JP] Japan ................................ 3-230328

[51] Int. Cl.$^5$ ............................................. G21K 5/00
[52] U.S. Cl. .................................... 378/34; 378/35
[58] Field of Search .................................... 378/34, 35

[56] References Cited

U.S. PATENT DOCUMENTS 4,855,197 8/1989 Zapka et al. ........................ 378/35
4,950,568 8/1990 Kraus ................................ 378/35

FOREIGN PATENT DOCUMENTS 0278076 8/1988 European Pat. Off. .
0385480 9/1990 European Pat. Off. .
0452043 10/1991 European Pat. Off. .

OTHER PUBLICATIONS

Pat. Abs. Jp., vol. 11, No. 173, Jun. 4, 1987 and JP-A-62005 243.

Primary Examiner—Craig E. Church
Attorney, Agent, or Firm—Fitzpatrick, Cella, Harper & Scinto

[57] ABSTRACT

An X-ray mask has a mask frame in which the central portion thereof is removed to form a concentric hole, and four grooves are radially formed in the surface of junction with a silicon substrate. On the other hand, a permeable film portion on which a pattern is provided is formed in the central portion of the silicon substrate, four through holes being formed in the perimeter of the permeable film portion in correspondence with the grooves. During exposure of a wafer, when the side of the permeable film portion is moved toward the wafer and brought close to it, the gas present between the wafer and the X-ray mask passes through the through holes and the grooves and flows from one side of the X-ray mask on which the permeable film portion is provided to the other side of the X-ray mask. Thus the pressure between the wafer and the X-ray mask is not increased. This permits an increase in the speed of movement of the X-ray mask without breaking the permeable film portion and improvement of the productivity of an exposure device.

12 Claims, 10 Drawing Sheets

X-RAY MASK AND SEMICONDUCTOR DEVICE MANUFACTURING METHOD USING THE SAME

BACKGROUND OF THE INVENTION

1. Field of the Invention

The present invention relates to an X-ray mask used in a semiconductor exposure device using an X-ray source, a method of manufacturing the X-ray mask and a semiconductor device manufacturing method using the X-ray mask.

2. Description of the Related Art

An example of generally known X-ray masks used in X-ray exposure devices is described below.

As shown in FIG. 10, an X-ray mask substrate 50 is joined to a mask frame 54. The X-ray mask substrate is produced by depositing an inorganic film 52 of SiN or the like on the surface of a silicon substrate 51, removing a portion corresponding to a permeable film portion 52a by dry etching, and removing a portion of the silicon substrate 51 which corresponds to the permeable film portion 52a by wet etching. A pattern 55 made of an X-ray absorber such as Ta, Au or the like is provided on the permeable film portion 52a in correspondence with a predetermined shape to be transferred to a wafer (not shown).

When exposure is performed by an exposure device to which the X-mask is fitted, the surface of the X-mask in which the pattern is formed is opposed to a wafer at a distance of about 30 μm. In this state, a portion of the wafer is exposed to light. When another portion of the wafer is then to be exposed to light, the distance between the X-ray mask and the wafer is increased to about 200 μm, and the X-ray mask is then moved to a position corresponding to the other portion. The distance between the X-ray mask and the wafer is then returned to about 30 μm, and the other portion is exposed.

The step-and-repeat operation is successively repeated to expose the wafer.

However, during exposure using the above conventional X-ray mask, when the X-ray mask once separated from the wafer is brought back close to it, if the X-ray mask is rapidly moved, the gas present in the gap between the X-ray mask and the wafer cannot easily escape from the gap and is thus compressed as the X-ray mask is brought close to the wafer. The pressure of the gas between the X-ray mask and the wafer is thus increased in correspondence with the speed of movement of the X-ray mask toward the wafer. This increase in the pressure causes a danger of breaking or damaging the permeable film portion serving as a permeable support film. There is also the problem that if the speed of movement of the X-ray mask toward the wafer is decreased for preventing the breakage of the permeable film portion, the productivity of the exposure device is decreased.

SUMMARY OF THE INVENTION

The present invention has been achieved for solving the above problems. It is a first object of the present invention to provide an X-ray mask and a method of producing the X-ray mask which permits an increase in the speed of movement thereof without breaking or damaging a permeable film portion and which increases the productivity of the exposure process.

It is a second object of the present invention to provide a semiconductor device manufacturing method with high productivity using the X-ray mask and a semiconductor device manufactured by the method.

Other objects of the present invention will be made apparent from the detailed description of preferred embodiments below.

BRIEF DESCRIPTION OF THE DRAWINGS

FIG. 2 is a drawing showing a process of manufacturing the X-ray mask shown in FIG. 1, in which

FIG. 5 shows a process of manufacturing the X-ray mask shown in FIG. 4 and is a sectional view of the X-ray mask taken along a plane passing through the center of the X-ray mask and parallel to one side thereof, in which

DETAILED DESCRIPTION OF THE PREFERRED EMBODIMENTS

Embodiments of the present invention are described below with reference to the drawings.

Figure 1:
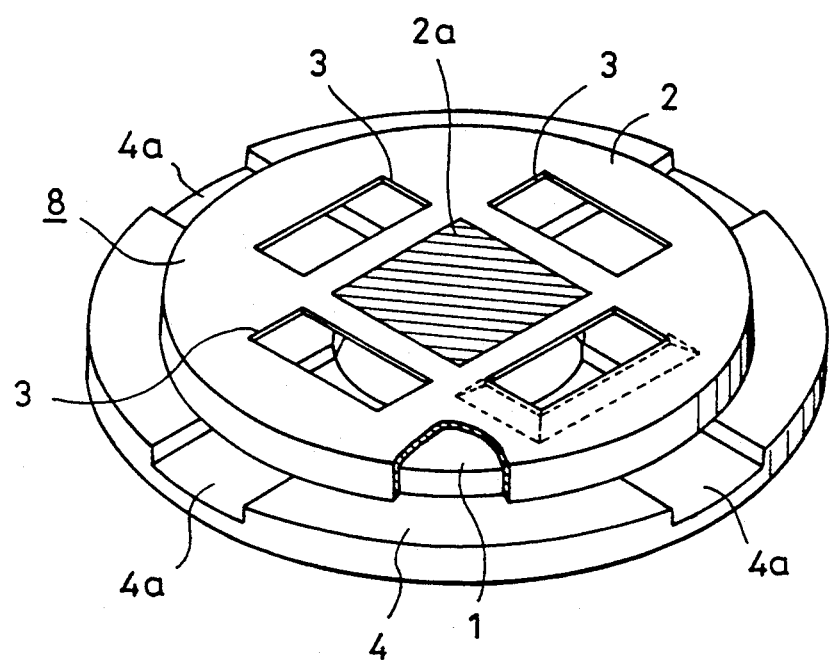
FIG. 1 is a partially broken-out perspective view of an X-ray mask in accordance with a first embodiment of the present invention.

An X-ray mask in accordance with a first embodiment of the present invention is described below with reference to FIG. 1.

The X-ray mask of this embodiment comprises a disk-like mask frame 4 having an opening concentrically formed at the center thereof, and an X-ray mask substrate 8 joined to the surface of the mask frame 4 and having a diameter greater than the diameter of the opening of the mask frame 4.

Four grooves 4a are radially formed at equal intervals in the plane of the mask frame 4 which is joined to the X-ray mask substrate 8, so that the grooves 4a connect the internal periphery of the mask frame 4 with the external periphery thereof and communicate with the through holes 3 below.

On the other hand, the X-ray mask substrate 8 comprises a silicon substrate 1 having an inorganic film 2 of SiN or the like deposited on the surface thereof. The central portion of the silicon substrate 1 is rectangularly removed leaving the inorganic film 2 on the side opposite to the junction plane of the mask frame 4. A permeable film portion 2a (the shadowed portion shown in FIG. 1) comprising the inorganic film 2 on the side opposite to the junction plane is formed in the central portion of the silicon substrate 1. A pattern 5 (refer to FIG. 2(E)) made of an X-ray absorber such as Ta, Au or the like is provided on the permeable film portion 2a in correspondence with a predetermined shape to be transferred to a wafer.

Four rectangular through holes 3 each serving as a gas passage are formed around the permeable film portion 2a of the silicon substrate 1 so as to respectively correspond to the grooves 4a formed in the mask frame 4.

The process of manufacturing the X-ray mask of this embodiment is described below with reference to FIG. 2.

Figure 2A:
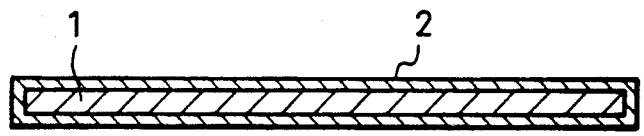
FIG. 2(A) is a drawing showing a step of depositing an inorganic film on a silicon substrate.

As shown in FIG. 2(A), the inorganic film 2 of SiN or the like is first deposited on the surface of the silicon substrate 1.

Figure 2B:
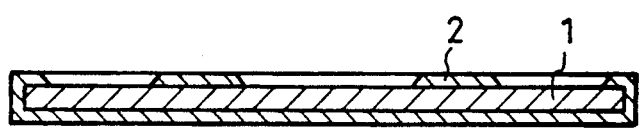
FIG. 2(B) is a drawing showing a step of removing portions of the inorganic film which correspond to a permeable film portion and through holes.

A dry etching resist is then coated on the inorganic film 2, and portions of the resist which correspond to the permeable film portion 2a and the through holes 3 are removed by exposure to form a dry etching mask. As shown in FIG. 2(B), portions on the upper side of the inorganic film 2 which correspond to the permeable film portion 2a and the through holes 3 are removed by dry etching.

Figure 2C:
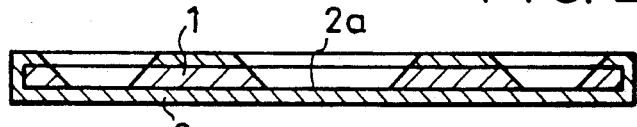
FIG. 2(C) is a drawing showing a step of removing portions of the silicon substrate from which the inorganic film is removed.

As shown in FIG. 2(C), portions of the silicon substrate 1 from which the inorganic film 2 is removed are removed by wet etching to form the permeable film portion 2a.

Figure 2D:
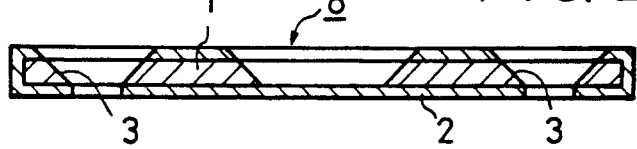
FIG. 2(D) is a drawing showing a step of removing portions of the inorganic film which correspond to the through holes.

As shown in FIG. 2(D), the remaining portions of the inorganic film 2 which respectively correspond to the through holes 3 are removed to form the through holes 3. In this way, the X-ray mask substrate 8 is formed. The portions of the inorganic film 2 which are desired to be removed may be removed by wet etching or mechanical means using a cutter or the like.

Figure 2E:
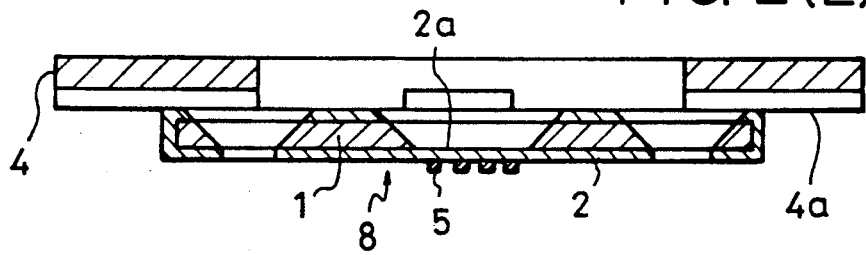
FIG. 2(E) is a drawing showing a step of joining a mask frame to the X-ray mask substrate formed through the steps shown in FIGS. 2(A) to 2(D)

As shown in FIG. 2(E), the pattern 5 made of an X-ray absorber such as Ta, Au or the like is then formed on the lower side of the inorganic film 2 shown in the drawing on the permeable film portion 2, and the through holes 3 are respectively aligned with the grooves 4a. The X-ray mask substrate 8 is joined to the mask frame 4 in parallel with each other by an adhesive.

Figure 3:
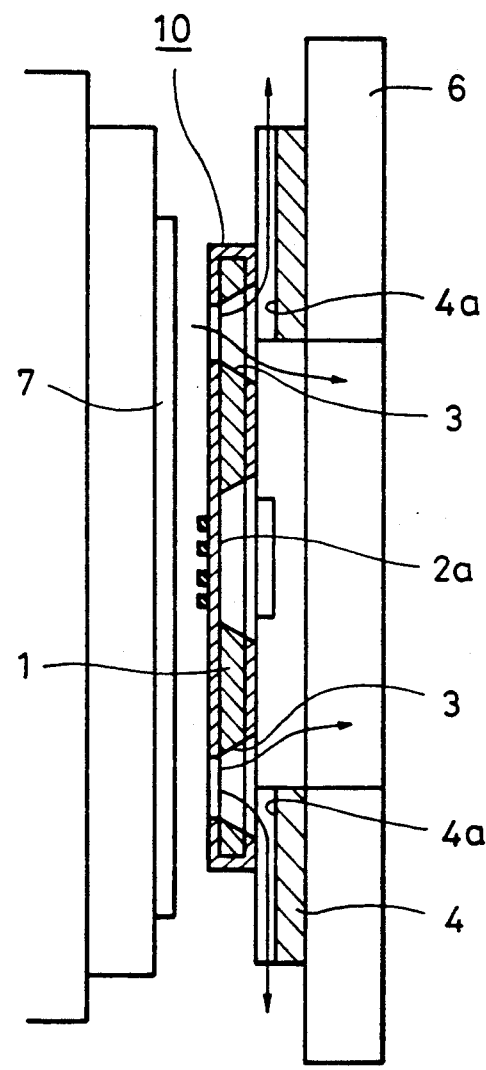
FIG. 3 is a sectional view of a principal portion showing the flow of gas when the X-ray mask shown in FIG. 1 is attached to an exposure device and is brought close to a wafer.

When exposure is performed using the X-ray mask of this embodiment, as shown in FIG. 3, the X-ray mask 10 vertically held by a mask chuck 6 is moved to the left of the drawing so as to be brought close to a wafer 7. At this time, the He gas present between the X-ray mask 10 and the wafer 7 passes through the through holes 3 and the grooves 4a and flows to the side of the X-ray mask 10 and to the mask chuck 6. Thus the pressure of the He gas present between the X-ray mask and the wafer 7 is not increased, and if the X-ray mask 10 is rapidly brought close to the wafer 7, there is no danger of breaking the permeable film portion 2a serving as a permeable support film.

In addition, the formation of the through holes 3 and the grooves 4a in the X-ray mask substrate 8 and the mask frame 4, respectively, decreases the weight of the X-ray mask 10 and thus decreases the load on a mask conveyance system comprising a mask hand or the like in an exposure device. As a result, the mask conveyance system can be decreased in size and weight.

Although, in this embodiment, four through holes 3 and four grooves 4a are formed, the number of through holes or grooves is not limited to 4, and can be changed according to demand. In addition, the grooves 4a need not be provided, and through holes may be formed in the mask frame 4 in place of the grooves 4a. However, when through holes are formed in the mask frame 4, X-ray radiation must be shielded by an aperture so as to prevent the X-rays from leaking from the through holes.

Figure 4:
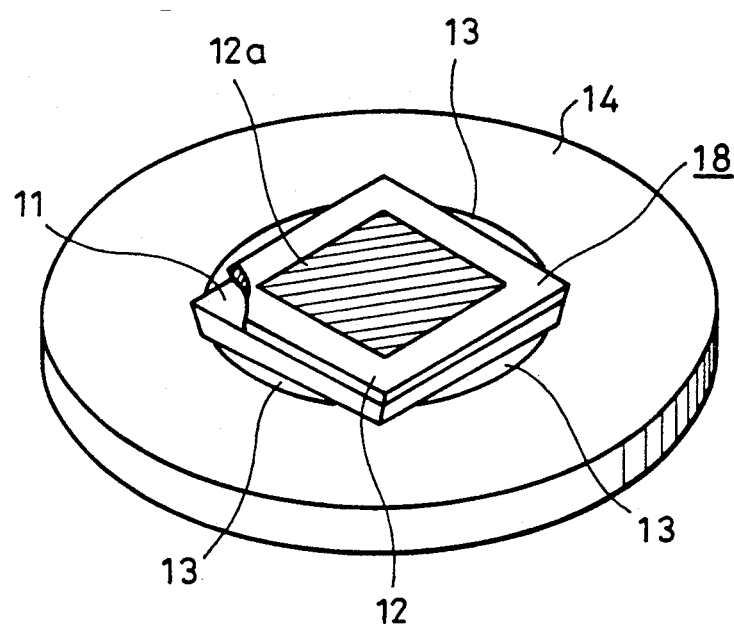
FIG. 4 is a partially broken-out perspective view of an X-ray mask in accordance with a second embodiment of the present invention.

An X-ray mask in accordance with a second embodiment of the present invention is described below with reference to FIG. 4.

The X-ray mask of this embodiment comprises a disk-like mask frame 14 having an opening concentrically formed in the central portion thereof, and a square plate X-ray mask substrate 18 joined to the surface of the mask frame 14.

The X-ray mask substrate 18 comprises a silicon substrate 11 having an inorganic film 12 formed on the surface thereof. The X-ray mask substrate 18 also has a permeable film portion 12a (the shadowed portion shown in the drawing) formed in the central portion thereof. The length of the diagonal of the X-ray mask substrate 18 is greater than the diameter of the opening of the mask frame 14, and the length of one side of the X-ray mask substrate 18 is smaller than the diameter of the opening of the mask frame 14. In the state where the X-ray mask 18 is joined to the mask frame 14, the opening of the mask frame 14 is thus not closed by the X-ray mask substrate 18, thereby forming gaps 13 serving as gas passages between the opening and the X-ray mask 18.

Since the permeable film portion 12a may be configured in the same way as that in the first embodiment, it is not described below.

The process of manufacturing the X-ray mask of this embodiment is described below with reference to FIG. 5.

Figure 5A:
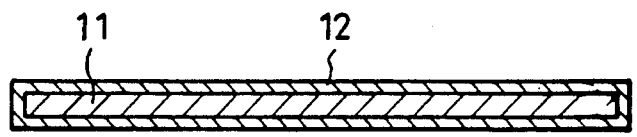
FIG. 5(A) is a drawing showing a step of depositing an inorganic film on a silicon substrate.

As shown in FIG. 5(A), the inorganic film 12 of SiN or the like is deposited on the surface of the silicon substrate 11.

Figure 5B:
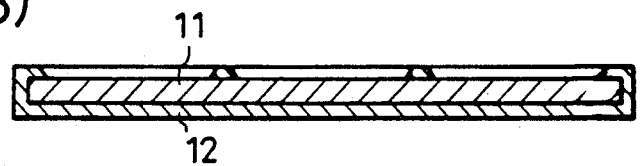
FIG. 5(B) is a drawing showing a step of removing a portion of the inorganic film which corresponds to a permeable film portion and the circumference thereof.

A dry etching resist is then coated on the inorganic film 12, and portions of the resist corresponding to the permeable film portion and the circumference thereof are removed by exposure to form a dry etching mask. As shown in FIG. 5(B), portions of the inorganic film 12 on the upper side thereof, which correspond to the permeable film portion and the circumference thereof, are removed by dry etching.

Figure 5C:
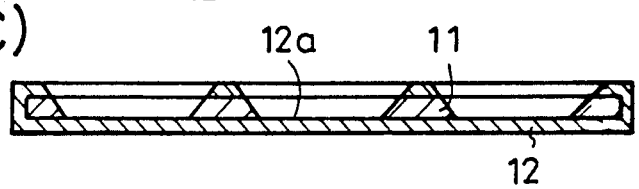
FIG. 5(C) is a drawing showing a step of removing the portion of the silicon substrate from which the inorganic film is removed.

As shown in FIG. 5(C), portions of the silicon substrate 11 from which the inorganic film 12 is removed are removed by wet etching to form the permeable film portion 12a.

Figure 5D:
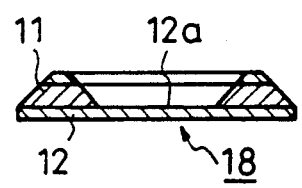
FIG. 5(D) is a drawing showing a step of removing the circumference of the permeable film portion.

As shown in FIG. 5(D), the portions of the inorganic film 12 which remain in the circumference are removed to form the X-ray mask substrate 11. A portion of the inorganic film 12 which is desired to be removed may be removed by wet etching or mechanical means using a cutter or the like.

Figure 5E:
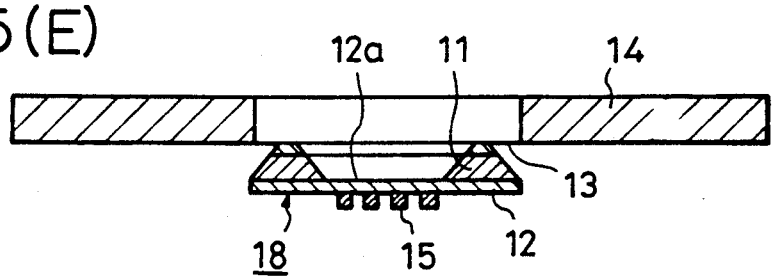
FIG. 5(E) is a drawing showing a step of joining a mask frame to the X-ray mask substrate manufactured through the steps shown in FIGS. 5(A) to 5(D)

As shown in FIG. 5(E), a pattern 15 made of an X-ray absorber such as Ta, Au or the like is formed on the lower side of the inorganic film 12 on the permeable film portion 12a shown in the drawing, and the X-ray mask substrate 11 is joined to the mask frame 14 in parallel with each other by an adhesive.

Figure 6:
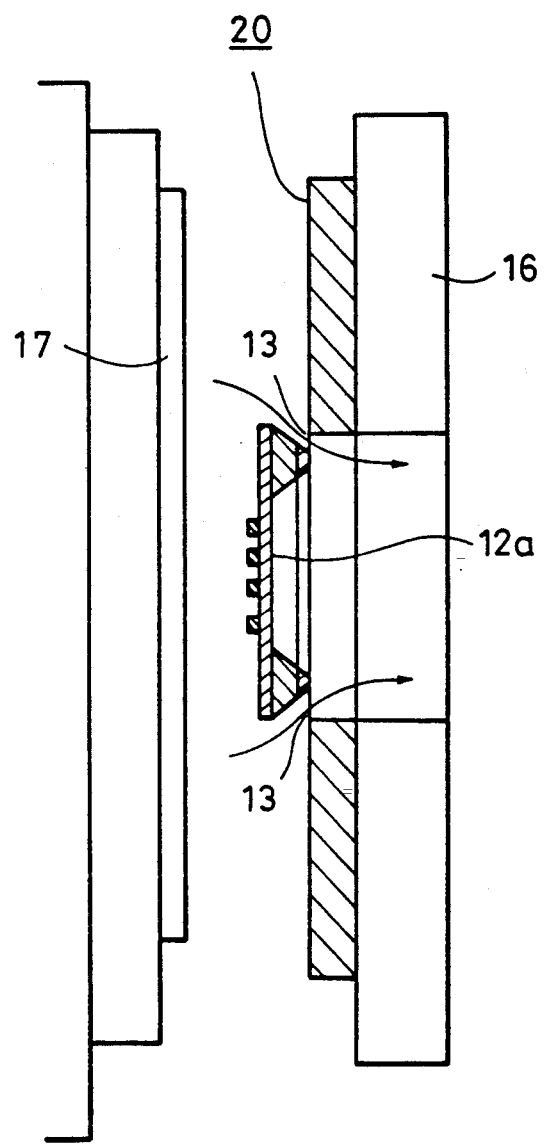
FIG. 6 is a sectional view of a principal portion showing the flow of gas when the X-ray mask shown in FIG. 4 is fitted to an exposure device and is brought close to a wafer.

During exposure using the X-ray mask of this embodiment, when the X-ray mask 20 vertically held by a mask chuck 16 is moved to the left of the drawing so as to be brought close to a wafer 17, as shown in FIG. 6, the He gas present between the X-ray mask 20 and the wafer 17 passes through each of the gaps 13 and flows to the mask chuck 16, as shown by arrows in the drawing. Thus the pressure of the He gas present between the X-ray mask 20 and the wafer 17 is not increased, and there is no danger of breaking the permeable film portion 12a serving as a permeable support film even if the X-ray mask 20 is rapidly brought close to the wafer 17.

In addition, since the X-ray mask substrate 18 has a necessary minimum configuration including the permeable film portion 12a, it is possible to decrease the weight of the X-ray mask 20 and decrease the load on a mask conveyance system comprising a mask hand or the like in an exposure device. The mask conveyance system can be consequently decreased in size and weight.

Further, since the area of the portion facing the wafer is decreased by decreasing the size of the X-ray mask substrate 18, the flatness of the plane of the X-ray mask 20 which faces the wafer 17 can be improved.

Although, in the X-ray mask of the above embodiment, the X-ray mask substrate 18 and the opening of the mask frame 14 have a rectangular shape and a circular shape, respectively, both shapes may be interchanged. Any desired shape can be selected unless the opening is closed by the X-ray mask substrate 18 when the X-ray mask substrate 18 is joined to the mask frame 14.

In the X-ray mask of each of the embodiments, the X-ray mask substrate has gas passages provided in the perimeter of the permeable film portion so as to connect the one side of the substrate with the other side thereof. This causes the gas present between the X-ray mask and the wafer to pass through the gas passages and flow to the other side of the X-ray mask substrate when the X-ray mask is moved toward the wafer during exposure, without increasing the pressure between the X-ray mask and the wafer. Since there is thus no danger of breaking the permeable film portion, it is possible to increase the speed of movement of the X-ray mask and improve the productivity of the exposure device. This is significantly effective for step-and-repeat type exposure. In addition, since the weight of the X-ray mask is decreased by providing the gas passages in the X-ray mask substrate, the mask conveyance system of the exposure device can be decreased in size and weight.

In addition, when the grooves are radially formed in the surface of the mask frame which is joined to the X-ray mask substrate so as to communicate with the gas passages so that when the X-ray mask is moved toward the wafer, the gas present between the X-ray mask and the wafer can be effectively made to escape from the spaces between the X-ray mask and the wafer.

Further, since gaps are produced between the opening of the mask frame and the X-ray mask substrate, when the X-ray mask is moved toward the wafer during exposure, the gas present between the X-ray mask and the wafer passes through the gaps and flows to the other side of the X-ray mask substrate, without increasing the pressure between the X-ray mask and the wafer. Since there is thus no danger of breaking the permeable film portion, it is possible to increase the speed of movement of the X-ray mask and improve the productivity of the exposure device. Since the X-ray mask substrate has a necessary minimum structure outside of the circumference of the permeable film portion, the X-ray mask substrate can be decreased in weight, and the mask conveyance system of the exposure device can be decreased in size and weight. The smallness of the area of the surface of the X-ray mask substrate which faces the wafer during exposure permits improvement in the flatness of the surface.

In the method of manufacturing the X-ray mask substrate, the gas passages are formed by removing the inorganic film remaining in the portions on the other side of the silicon substrate, which correspond to the gas passages, in the same process as that for forming the permeable film portion. In this way, the gas passages can easily be formed by adding a simple step of removing the inorganic film in portions corresponding to the gas passages to a conventional method of manufacturing an X-ray mask substrate.

Figure 7:
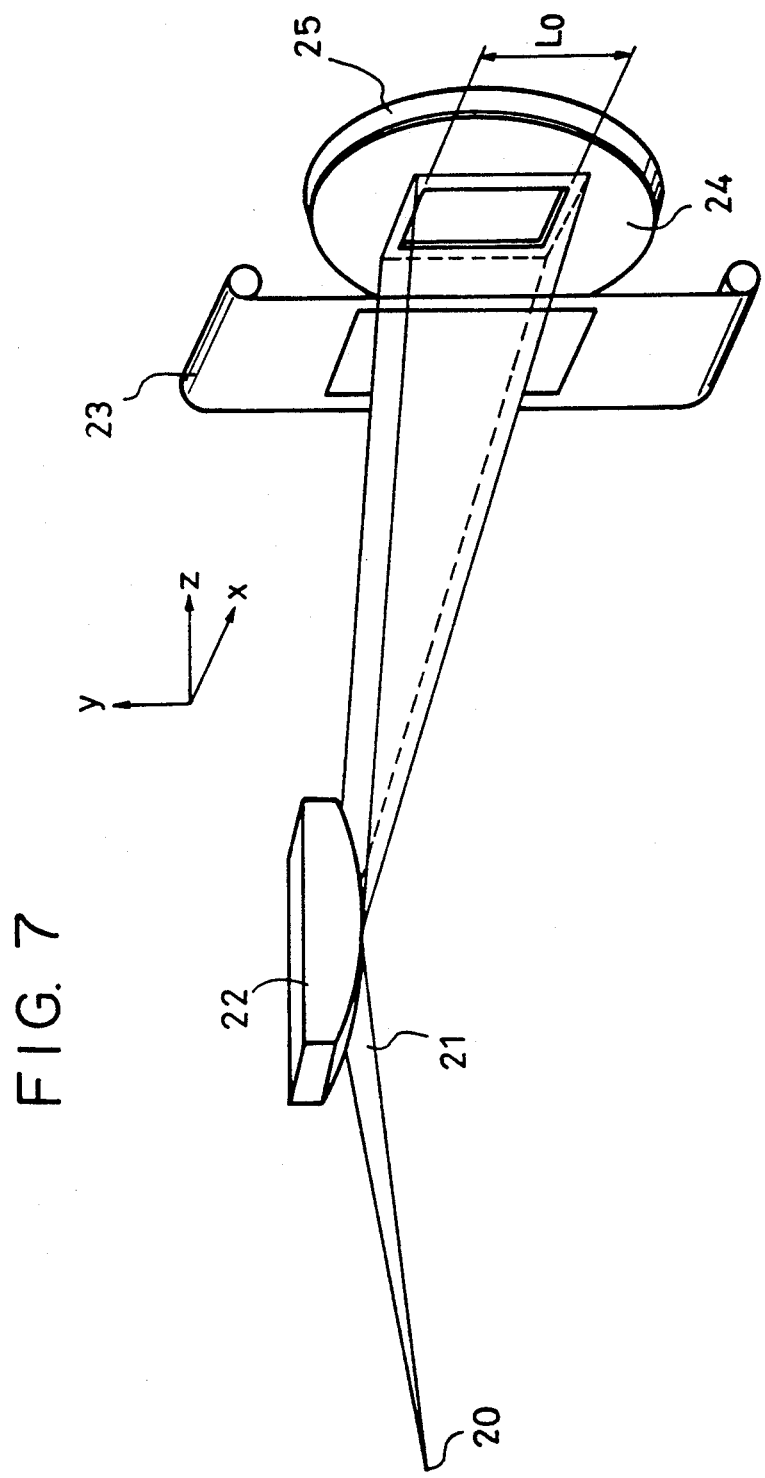
FIG. 7 is a drawing showing the arrangement of an X-ray exposure device.

A description will now be made of an embodiment of an X-ray exposure device for manufacturing a semiconductor device using the aforementioned X-ray mask. FIG. 7 is a drawing showing the configuration of the X-ray exposure device of this embodiment. In the drawing, the sheet beam-like synchrotron radiation emitted from a radiation source 20 such as an SOR ring or the like is enlarged and reflected by a fixed convex mirror 22 in the direction (y direction) vertical to the radiation orbital plane so that the whole exposure region $L_o$ can be irradiated. X-rays are extracted from the synchrotron radiation 21 reflected and enlarged by the convex mirror 22, and exposure within the irradiation region is adjusted by a shutter 23 for controlling exposure. The X-rays passing through the shutter 23 are led to an X-ray mask 24 held by a mask chuck. The X-ray mask 24 has the same structure as that of the above-described embodiments. The circuit pattern formed on the X-ray permeable film portion of the X-ray mask 23 is projected on a silicon wafer 25 coated with a resist by step-and-repeat type exposure.

The X-ray exposure device of this embodiment permits an increase in the speed of movement of the X-ray mask toward the wafer and thus has the effect of increasing the productivity. This effect is remarkable in step-and-repeat type exposure in which the operation of bringing the X-ray mask close to the wafer is repeated several times.

Figure 8:
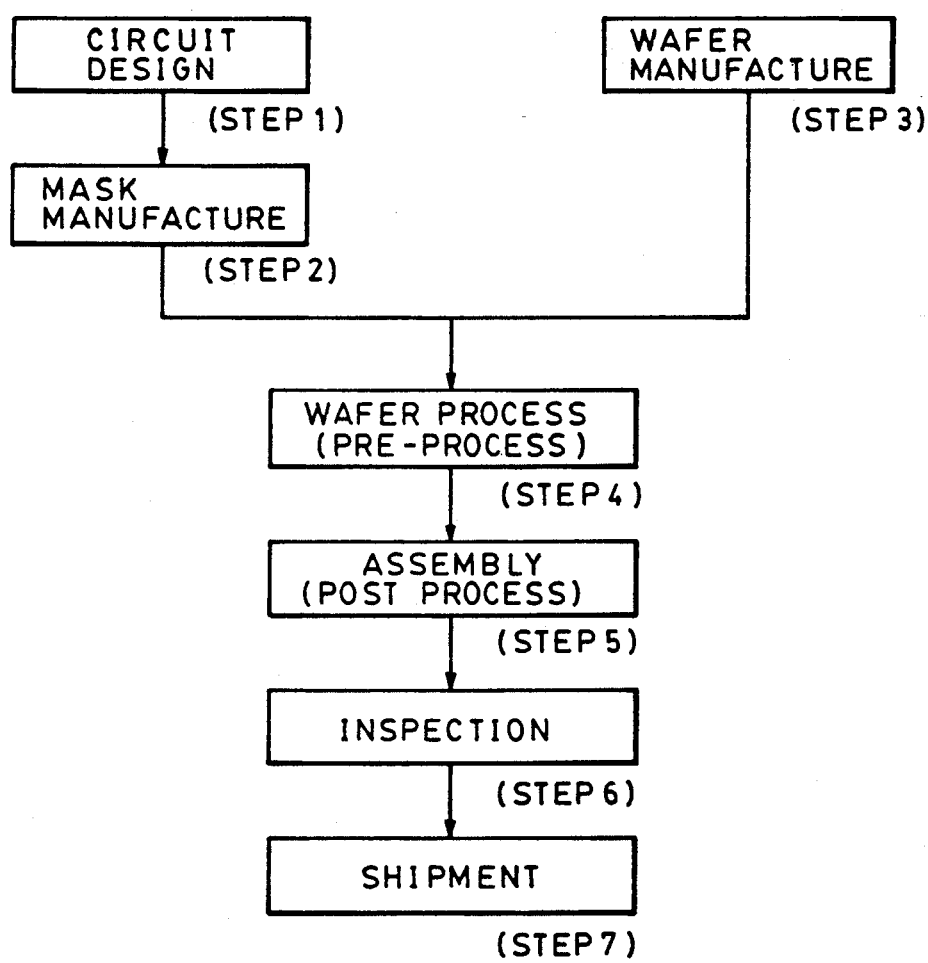
FIG. 8 is a drawing showing a semiconductor device manufacture flow.

A description will now be made of an embodiment of a semiconductor device manufacturing method employing the above exposure device. FIG. 8 shows a manufacture flow for semiconductor devices (a semiconductor chip such as IC, LSI or the like, a liquid crystal panel, CCD or the like). In Step 1 (circuit design), the circuit of a semiconductor device is designed. In Step 2

(mask manufacture), a mask on which the designed circuit pattern is formed is manufactured. In Step 3 (wafer manufacture), a wafer is manufactured using a material such as silicon or the like. In Step 4 (wafer process, which is called pre-process), an actual circuit is formed on the wafer by lithography using the prepared mask and wafer. In Step 5 (assembly, called post-process), a semiconductor chip is formed by using the wafer produced in Step 4. The post-process comprising the assembly step (dicing, bonding), the packaging step (chip sealing) and the like. In Step 6 (inspection), tests of the semiconductor device formed in Step 5, such as the operation confirmation test, the durability test and the like, are carried out. The semiconductor devices completed through the above steps are shipped (Step 7).

Figure 9:
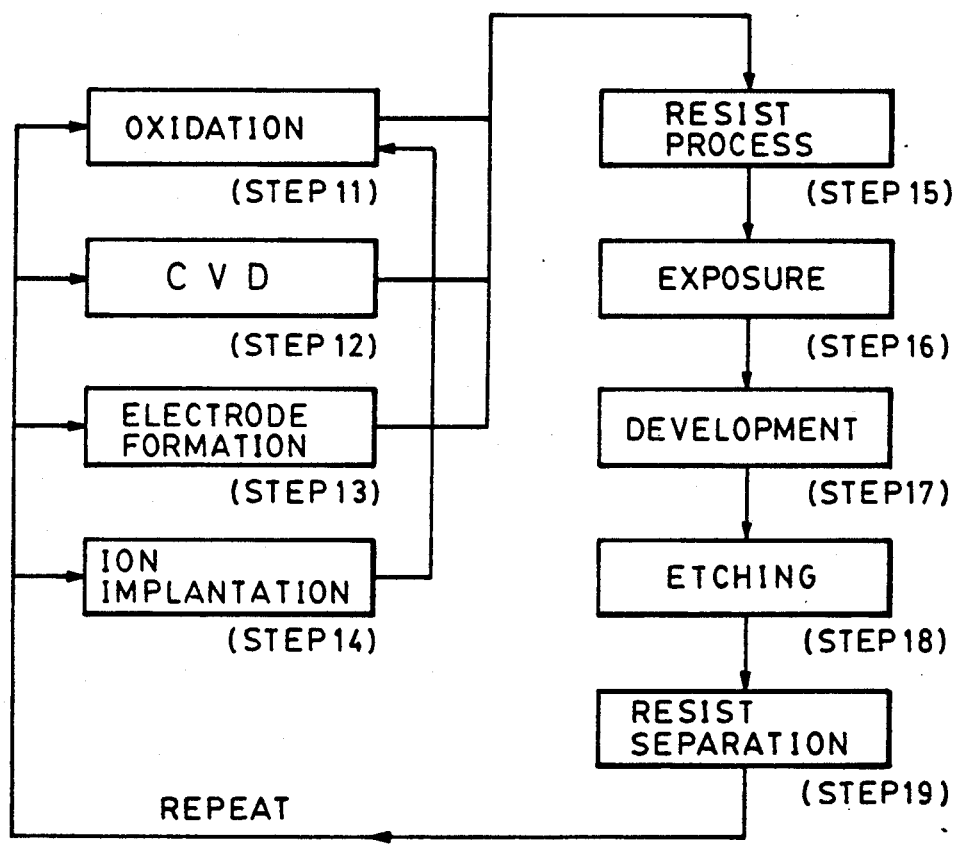
FIG. 9 is a drawing showing a wafer process flow.
Figure 10:
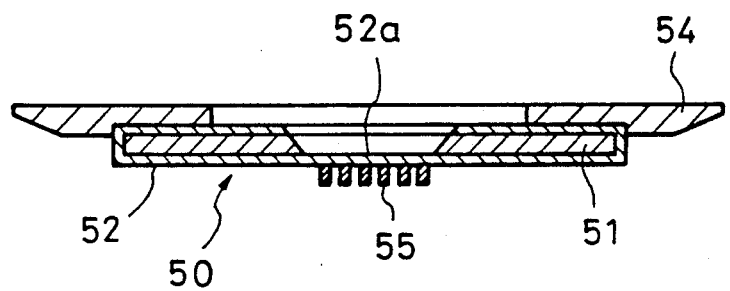
FIG. 10 is a sectional view of a conventional X-ray mask.

FIG. 9 shows the detailed flow of the above wafer process. In Step 11 (oxidation), the surface of the wafer is oxidized. Step 12 (CVD), an insulating film is formed on the surface of the wafer. In Step 13 (electrode formation), electrodes are formed on the wafer by vapor deposition. In Step 14 (ion implantation), ions are implanted in the wafer. Step 15 (resist process), a sensitizer is coated on the wafer. In Step 16 (exposure), the circuit patter on the mask is transferred to the wafer by exposure using the aforementioned exposure device. In Step 17 (development), the wafer exposed is subjected to development. In Step 18 (etching), portions other than the developed resist image are etched. In Step 19 (resist separation), after etching, the unnecessary resist is removed. These steps are repeated to form a multiple circuit pattern on the wafer.

The above description has been given on preferred embodiments of the present invention, but it will be apparent to those of ordinary skill in the art that many changes and variations are possible without departing from the scope of the present invention, which is to be determined by reference to the appended claims.

What is claimed is:

1. An X-ray mask comprising:
    a substrate;
    a permeable film portion provided on and at a side of said substrate and being permeable to X-rays;
    a mask pattern formed on said permeable film portion; and
    gas passages provided around said mask pattern and connecting said side of said substrate with an opposing side thereof.

2. An X-ray mask according to claim 1, wherein said substrate comprises silicon.

3. An X-ray mask according to claim 1, wherein said permeable film portion comprises an inorganic film deposited on a surface of said substrate.

4. An X ray mask according to claim 3, wherein said inorganic film comprises SiN.

5. An X-ray mask according to claim 1, further comprising a mask frame, an opening provided in said mask frame communicating with said gas passages.

6. An X-ray mask according to claim 5, wherein said opening comprises grooves radially formed in a surface of said mask frame that is joined to said X-ray mask, so as to communicate with said gas passages.

7. An X-ray mask according to claim 1, wherein said mask pattern comprises a circuit pattern of a semiconductor device.

8. An X-ray mask producing method comprising:
    depositing an inorganic film on a surface of a silicon substrate;
    removing first portions of said inorganic film on one side of said silicon substrate, which first portions correspond to a desired permeable film portion and gas passages in a perimeter of said permeable film portion;
    removing portions of said silicon substrate, which portions correspond to said permeable film portion and said gas passages; and
    removing second portions of said inorganic film on an opposing side of said silicon substrate, which second portions correspond to said gas passages, to form said gas passages so as to connect the one side of said silicon substrate with the opposing side thereof.

9. An X-ray exposure device comprising:
    a radiation source emitting X-rays;
    a mask chuck for mounting an X-ray mask;
    optical means for applying the X-rays emitted from said radiation source to said X-ray mask so as to transfer a mask pattern to a wafer by exposure;
    wherein said X-ray mask comprises:
    a substrate;
    a permeable film portion provided on and at a side of said substrate and transmitting X-rays;
    a mask pattern formed on said permeable film portion; and
    gas passages provided around said mask pattern so as to connect said side of said substrate with an opposing side thereof.

10. A semiconductor device manufacturing method by X-ray exposure comprising:
    a first step of disposing a wafer and an X-ray mask on which a circuit pattern is formed in a predetermined positional relation therebetween; and
    a second step of transferring the circuit pattern to the wafer by exposure of the X-ray mask to X-rays;
    wherein the X-ray mask comprises:
    a substrate;
    a permeable film portion provided on and at a side of the substrate and transmitting X-rays;
    a circuit pattern formed on the permeable film portion; and
    gas passages provided around the circuit pattern so as to connect the side of said substrate with an opposing side thereof.

11. A method according to claim 10, wherein said first step includes a step of bringing the circuit pattern of the mask close to the wafer.

12. A method according to claim 10, wherein said first and second steps are repeated to transfer by exposure the circuit pattern to each of a plurality of regions of the wafer.

* * * * *